United States Patent [19]

Muramoto et al.

[11] Patent Number: 5,043,831
[45] Date of Patent: Aug. 27, 1991

[54] ERASING DEVICE

[75] Inventors: Tomotaka Muramoto, Tokyo; Makoto Takayama, Kanagawa, both of Japan

[73] Assignee: Canon Kabushiki Kaisha, Tokyo, Japan

[21] Appl. No.: 580,343

[22] Filed: Sep. 6, 1990

Related U.S. Application Data

[63] Continuation of Ser. No. 192,947, May 12, 1988, abandoned.

[30] Foreign Application Priority Data

May 15, 1987 [JP] Japan .................................. 62-119307
Dec. 10, 1987 [JP] Japan .................................. 62-310965

[51] Int. Cl.5 ............................................. G11B 5/47
[52] U.S. Cl. .................................................... 360/66
[58] Field of Search .......................................... 360/66

[56] References Cited

U.S. PATENT DOCUMENTS 4,742,404 5/1988 Yunoki .................................. 360/66
4,766,505 8/1988 Nakano et al. ..................... 360/19.1
4,772,962 9/1988 Tanaka et al. ..................... 360/72.2

Primary Examiner—Vincent P. Canney
Attorney, Agent, or Firm—Robin, Blecker, Daley & Driscoll

[57] ABSTRACT

An erasing device for erasing a signal recorded on a recording medium on which an audio signal and a video signal are recorded together has a first erasing mode for erasing the audio signal, a second erasing mode for erasing the video signal, and a third erasing mode for erasing both the audio and video signals.

22 Claims, 7 Drawing Sheets

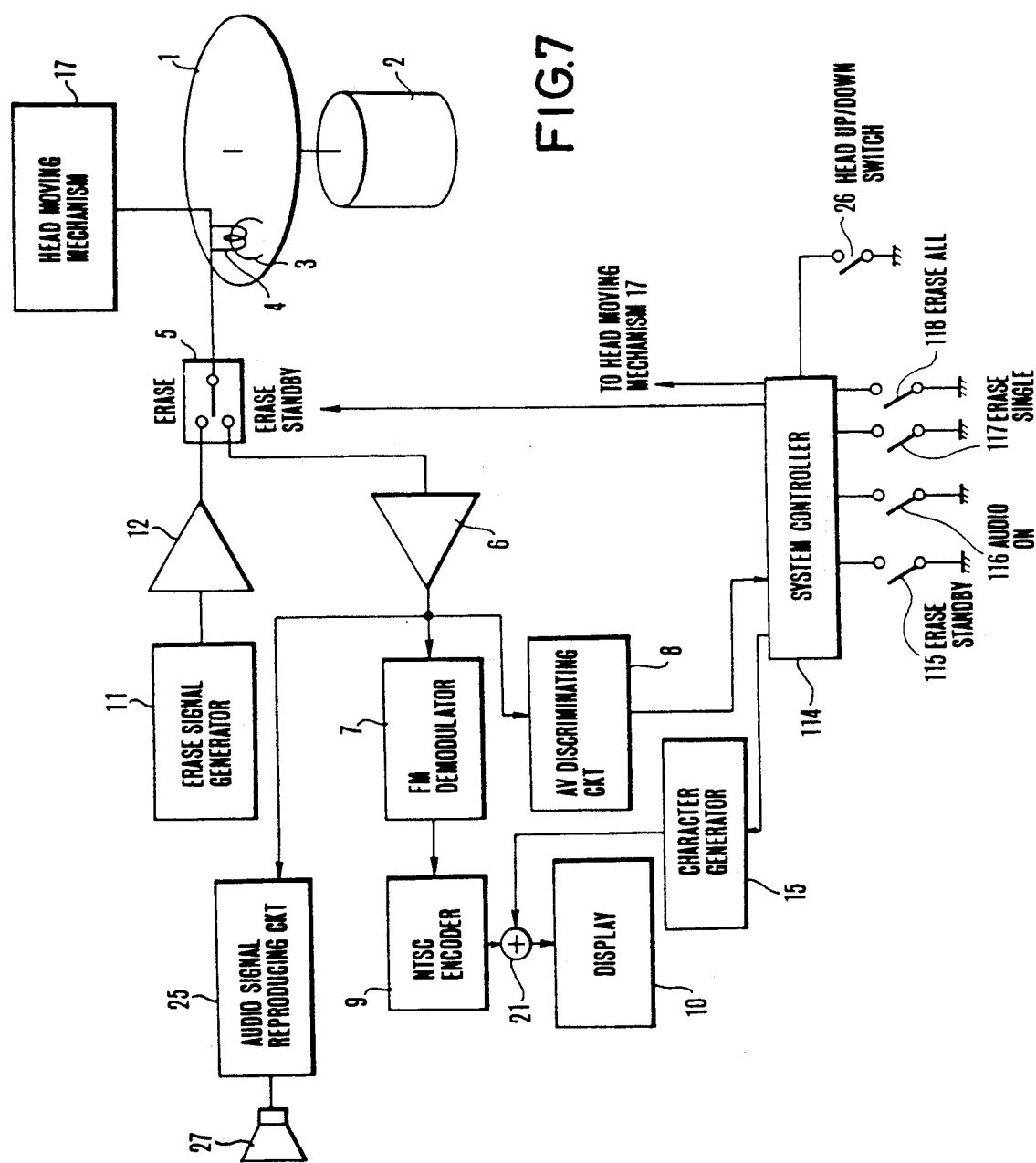

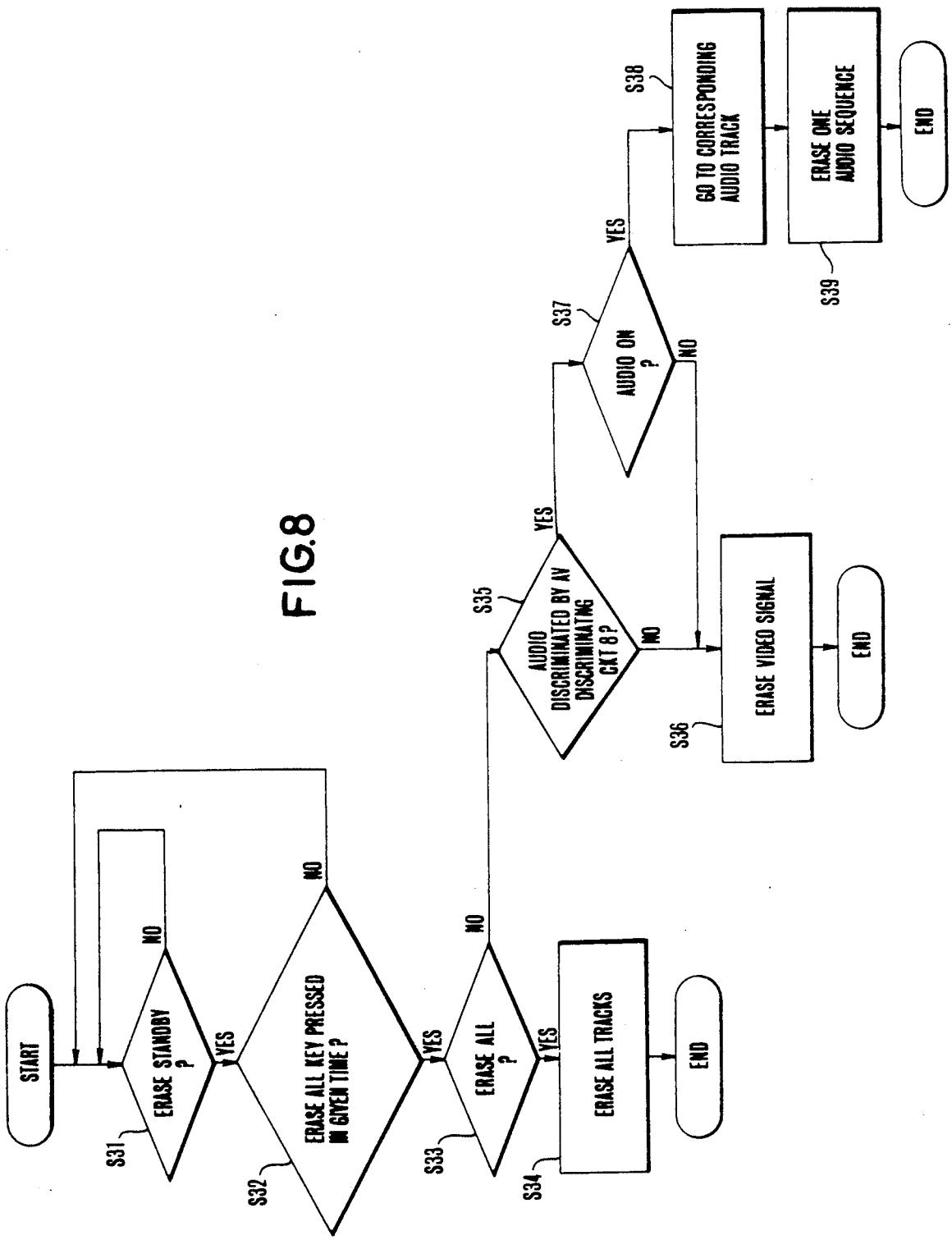

ERASING DEVICE

This application is a continuation of application Ser. No. 192,947, filed 5/12,88, now abandoned.

BACKGROUND OF THE INVENTION

1. Field of the Invention

This invention relates to an erasing device with the function of erasing information from a recording medium such as a floppy disk which is provided with tracks on which images exclusively are recorded and tracks on which sound exclusively is recorded, with the two kinds of information to be mixed as in a still video standard.

2. Description of the Related Art

FIG. 3 shows a flowchart of the conventional

An example of a conventional erasing procedure in a still video recording and reproducing apparatus provided with the function of erasing is in the flowchart shown in FIG. 3.

When erasing is performed, the "ERASE STANDBY" mode is first selected. Next, when the reproduction mode has not been selected, the reproduction mode is selected to reproduce an image in the track accessed by the head.

When the switch marked "ERASE ON" is pressed after a picture to be erased is recognized by the monitor, erasing of one track is performed.

Such an erasing method is described in U.S. Pat. Application Ser. No. 033,339, which is an application assigned to the assignee of this invention.

The method of recording audio signals which is defined on the basis of the still video standard is described below.

The time base of an audio signal is compressed so that the frequency band of the audio signal is raised to the band of a video signal, and is then recorded by using the same recording system as that used for the video signal. When the time needed to record a compressed audio signal exceeds the recording time for a single track, the audio signal can be recorded on a plurality of tracks.

A simple description will now be given of a recording format for an audio signal.

FIG. 5 shows an example of an audio track recorded on a track formed in a magnetic sheet. The audio track is divided into four sectors, $S_A$ to $S_D$, the format of each of the sectors is shown in FIG. 6. A start signal of an audio sector is indicated by a start flag SF recorded in the start position in one sector, and then the compression ratio of the time base of the audio signal, the address of the track of the video signal to which the audio signal corresponds, and, when the audio signal is continuously recorded in a plurality of tracks, the address of the track where the audio signal starts and the addresses of the following tracks where the audio signal is recorded are recorded as a control code for reproducing the audio signal track. When the audio signal is continuously recorded on a plurality of tracks, the tracks are considered as a single block which is referred to as one audio sequence hereinafter. When the audio signal is recorded on a single track, the track is also referred to as one audio sequence hereinafter.

When an audio signal recorded on a disk on which tracks of audio signals and tracks of video signals are mixed is erased in accordance with the conventional procedure shown in FIG. 3, then since the audio signal to be erased cannot be previously recognized, the procedure has a problem with respect to erroneous erasing.

In the above-described audio format, since an audio sequence can be controlled by the control code, it is unnecessary to recognize the track on which the audio signal to be erased is recorded. Therefore, a conventional erasing device has a problem in that, if the track containing the audio signal to be erased is not known beforehand, the audio signal cannot be easily erased.

The conventional erasing device also has a problem in that, when it is desired to erase only the video signal, then it must be determined whether the video signal is in an audio sequence or is unrelated to any audio signal. Otherwise, erroneous erasing may be made in some cases.

In addition, when the video signal corresponding to an audio signal is erased, it is necessary to change the contents assigned by the control code on the track of the audio signal.

SUMMARY OF THE INVENTION

It is an object of this invention to provide a novel erasing device which is capable of solving each or all of the above-described problems.

It is another object of this invention to provide an erasing device which is capable of erasing by a simple operation both a video signal and an audio signal which correspond to each other and which must be reproduced as a pair.

It is a further object of this invention to provide a device which can prevent accidental erasing of either the video signal or the audio signal, which are recorded as a pair in a recording medium.

It is a still further object of this invention to provide an erasing device which is capable of selectively erasing either a video signal or an audio signal in a satisfactory manner.

To attain these objects, in accordance with preferred embodiments of this invention, an erasing device for erasing an audio signal and a video signal are mixed and recorded in a recording medium which is provided with a first erasing mode for erasing the audio signal, a second erasing mode for erasing the video signal, and a third erasing mode for erasing both the video signal and the audio signal. Other objects and characteristics of this invention will be made apparent by the description of embodiments and the drawings below.

BRIEF DESCRIPTION OF THE DRAWINGS

FIG. 7 is a block diagram of the configuration of a third embodiment of this invention; and FIG. 8 is a flowchart showing the operation of the device of the embodiment shown in FIG. 7.

DETAILED DESCRIPTION OF THE PREFERRED EMBODIMENTS

The first embodiment described below of this invention has the following functions I) to III):

I) The ERASE mode is provided with the following three modes:

a) Only a video signal is erased. If there is a corresponding audio signal, erasure is not performed.

b) Both a video signal and an audio signal are erased.

c) Only an audio signal is erased.

II) When the ERASE STANDBY mode is selected, if a video signal is written on the track accessed by the head and the audio signal corresponding to the video signal is present elsewhere on the floppy disk, a monitor or a unit of the device indicates that the video signal has the audio signal.

III) When the ERASE STANDBY mode is selected, if the head accesses the track (audio track) on which an audio signal is recorded, the head is moved to the track (video track) on which the video signal corresponding to the audio track is recorded so as to reproduce the video signal.

In the above-described sequence, when a floppy disk as a recording medium on which the audio tracks and the video tracks are mixed is subjected to erasure, there are the following advantages:

(i) The contents of the audio tracks can be determined by the corresponding image.

(ii) It is possible to determine whether or not the audio signal corresponding to a video signal is present.

(iii) A video signal with an audio signal will not be accidentally erased if the mode for erasing the video track is separated from the mode for erasing the audio track.

A device in an embodiment having the above-described functions is described below with reference to the drawings.

Figure 4:
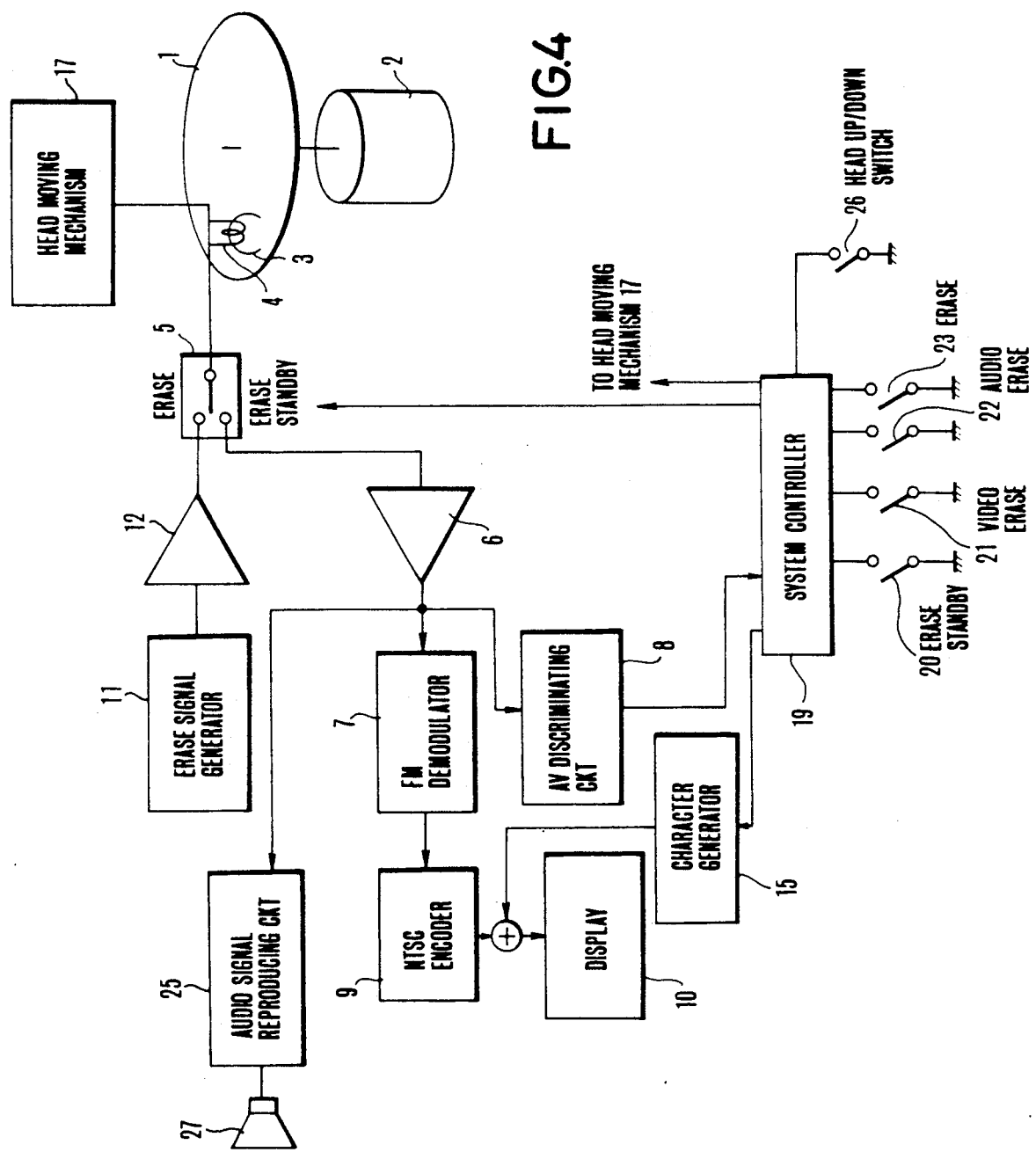
FIG. 4 is a block diagram of an embodiment which operates according to the flowcharts shown in FIGS. 1 and FIGS. 5 and 6 are explanatory views of a recording format of an audio signal.
Figure 5:
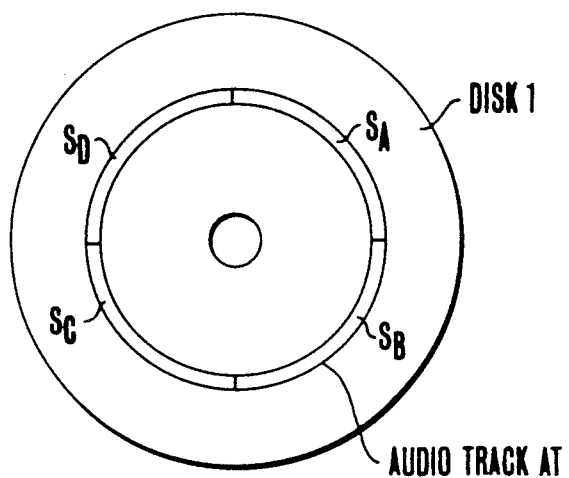
Figure 6:
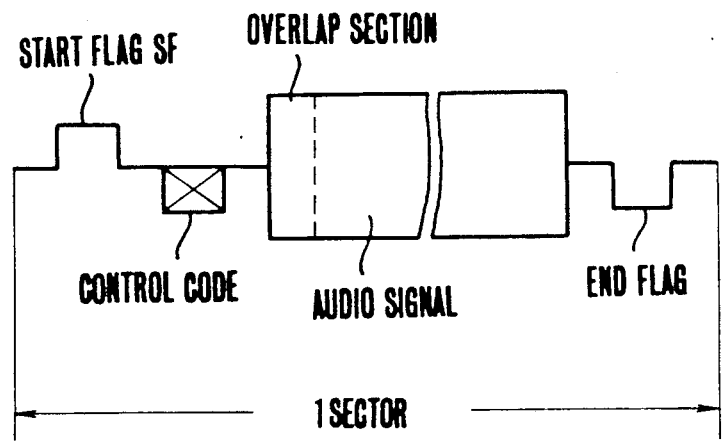

FIG. 4 is a block diagram showing the configuration of an embodiment of this invention.

In FIG. 4, reference numeral 1 denotes a magnetic sheet; reference numeral 2, a rotary motor for the magnetic sheet 1; reference numeral 3, a recording or reproducing head which is configured as a magnetic head and used also for erasing; and reference numeral 4, a recording or reproducing coil wound around the recording or reproducing head 3. Reference numeral 5 denotes a switch which is changed to the "ERASE STANDBY" side when the information recorded in the magnetic sheet 1 is brought into the erase standby state and to the "ERASE" side when the operation of erasing is executed in the erase standby state.

Reference numeral 6 denotes a reproduction amplifier; reference numeral 7, an FM demodulator which performs FM demodulation of the output from the reproduction amplifier 6; and reference numeral 8, an AV discriminating circuit which determines from the output from the reproducing amplifier 6 whether the signal recorded in the position accessed by the head 3 is an audio signal or a video signal, and which is capable of determining the ID signal recorded together with the video signal and the audio signal and detecting the address of the corresponding track. Reference numeral 9, an NTSC encoder which converts the output from the FM demodulator 7 into an NTSC signal; reference numeral 10, a display which reproduces the output from the encoder 9; reference numeral 11, an erasing signal generator which generates an erasing signal; reference numeral 12, an amplifier for amplifying the erasing signal; reference numeral 15, a character generator which generates a signal for indicating in Step S5 shown in FIG. 1 and Step S23 shown in FIG. 2 that the corresponding audio signal is present; reference numeral 17, a head moving mechanism which changes a position at which the head 3 reproduces; reference numeral 19, a system controller which controls each of the circuits so as to execute the flowchart shown in FIG. 1 or 2; reference numeral 20, a switch for setting the ERASE STANDBY mode; and reference numerals 21 and 22, a video erase switch and an audio erase switch which set the modes for erasing a video signal and an audio signal, respectively. The case in which either of the switches 21 and 22 is turned on corresponds to the modes a) and c) described in the function I), and the case in which both the switches 21 and 22 are turned on corresponds to the mode b). Reference numeral 23 denotes an erase switch which allows erasure to be executed; reference numeral 25, a reproducing circuit which reproduces audio signals and contains a time base expanding circuit; reference numeral 27, a speaker which reproduces sound; and reference numeral 26, a head moving-directing switch which moves the head 3 to the internal periphery of the magnetic sheet (up direction) or moves it to the outer periphery thereof (down direction).

When an item of information recorded in the magnetic sheet 1 is erased, the switch 5 is first changed to the "ERASE STANDBY" mode to set the erase standby state. In this state, the reproduction mode is automatically selected so that the signal recorded in a track which is to be erased is amplified by the reproduction amplifier 6 and demodulated by the FM demodulator 7 in the erase standby state, i.e., before erasure is executed. Then, the AV discriminating circuit 8 determines whether the signal to be erased is a video signal or an audio signal. When the signal is a video signal, the signal is converted into an NTSC signal by the NTSC encoder 9, and an image is displayed on the display 10 such as a CRT display. At this time, if there is a track in which the audio signal corresponding to that video signal is recorded, the display 10 indicates the presence of that track.

When the signal to be erased is an audio signal, if there is a track in which the video signal corresponding to that audio signal is recorded, that video signal is displayed on the display 10.

When the switch 5 is then changed to the "ERASE" side, the erasing signal is generated from the erasing signal generator 11 and is amplified by the amplifier 12 so that an item of the information recorded in the track is erased by the erasing signal.

A description will now be made of the operation of the embodiment of this invention configured as described above with reference to the flowchart.

Figure 1:
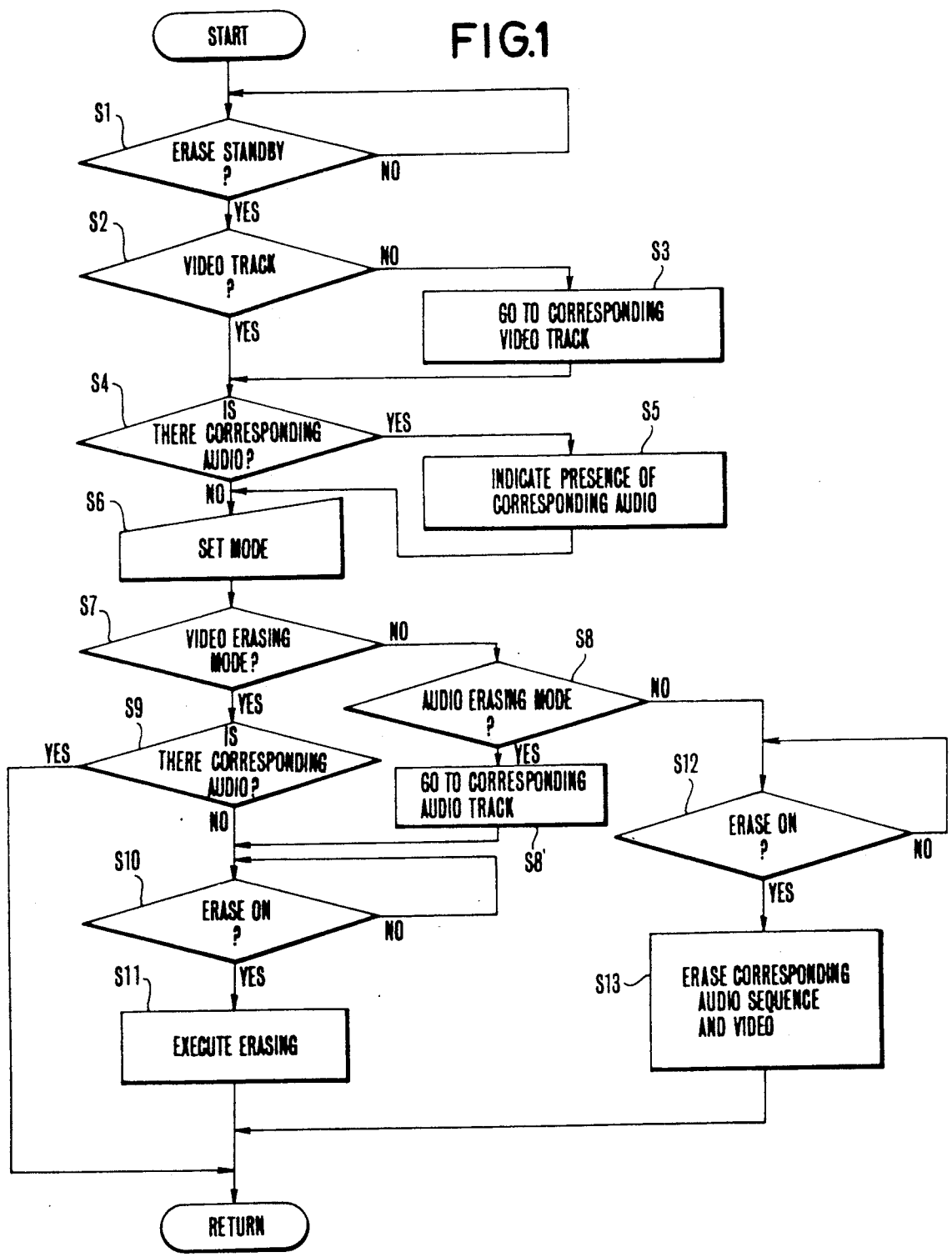
FIG. 1 is a flowchart of a first embodiment of this invention.

FIG. 1 is a flowchart of a first embodiment of this invention.

In FIG. 1, when the erase standby mode is selected by the erase standby switch 20 (S1). discrimination is first made as to whether the head 3 accesses a video track or an audio track (S2). When the head 3 accesses an audio track, a position at which the head 3 reproduces is moved to the video track corresponding to that audio track (S3). It should be noted that the number of the corresponding video track has been written in the audio track, and the AV discriminating circuit 8 determines the number. In this state, an image on a track to be erased or an image on the video track corresponding to the audio track can be recognized. When there is the audio track corresponding to the video track reproduced (S4), the presence is indicated on an image plane (S5). The indication of the presence may be superposed on the image plane by using the character generator 15 or performed by using another display element provided outside the image plane.

Then, the state of selection of the modes for erasing a video track, erasing an audio track, and erasing both the tracks is determined by the switches 21, 22 (S7, S8).

In the video erasing mode, if the presence of the corresponding audio track is detected in Step 9, erasure is not executed. Where no audio track is present, the video track is erased when the erase switch 23 is pressed (S10).

In the audio erasing mode, an audio sequence is erased (S11) when the erase switch 23 is pressed (S10) after the head 3 has been moved to the corresponding audio track S8').

When both the signals are erased, i.e. neither the video erasing mode nor the audio erasing mode is selected, the audio sequence corresponding to a video track and such video track are erased (S13) when the erase switch 23 is pressed (S12).

Figure 2:
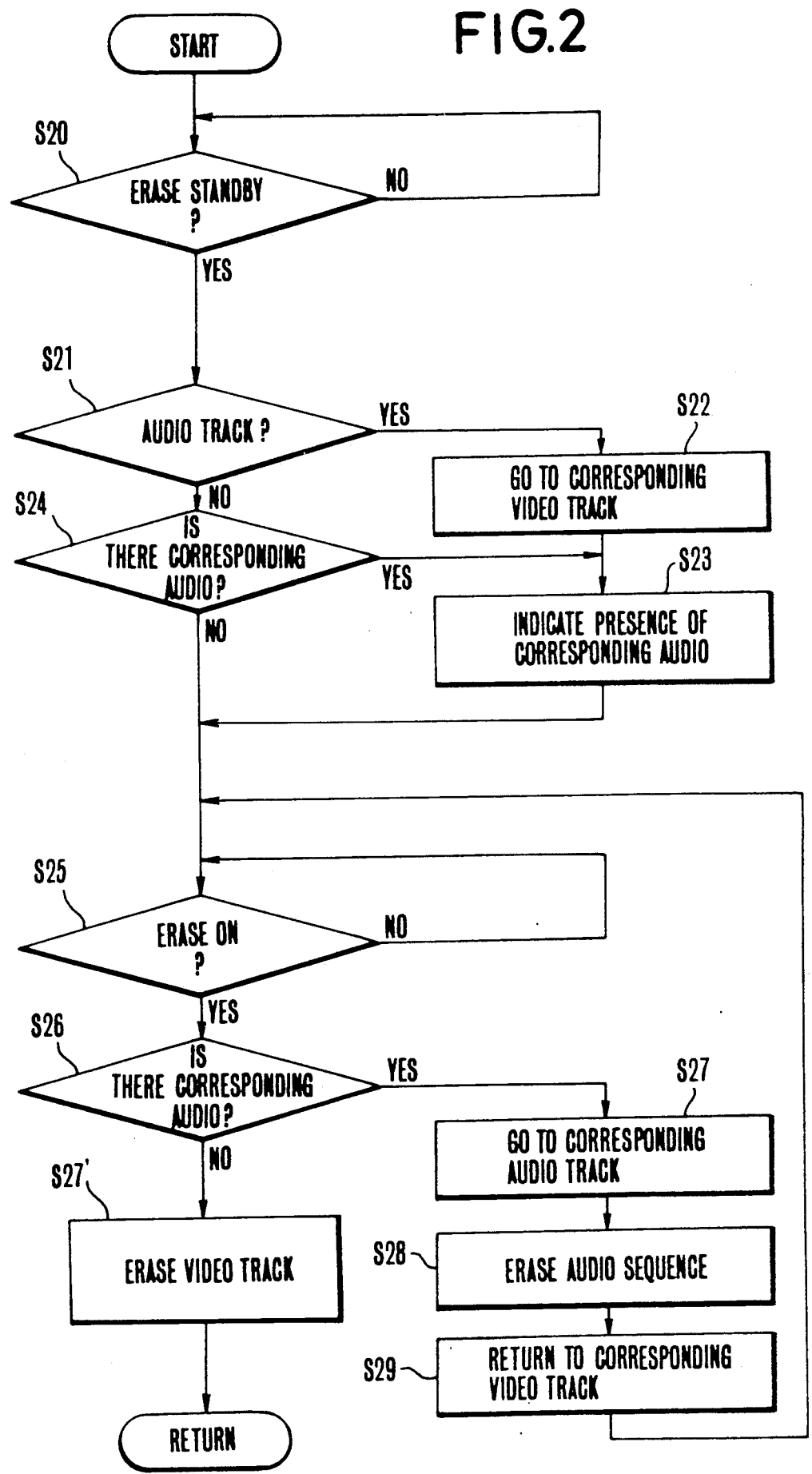
FIG. 2 is a flowchart of a second embodiment of this invention.
Figure 3:
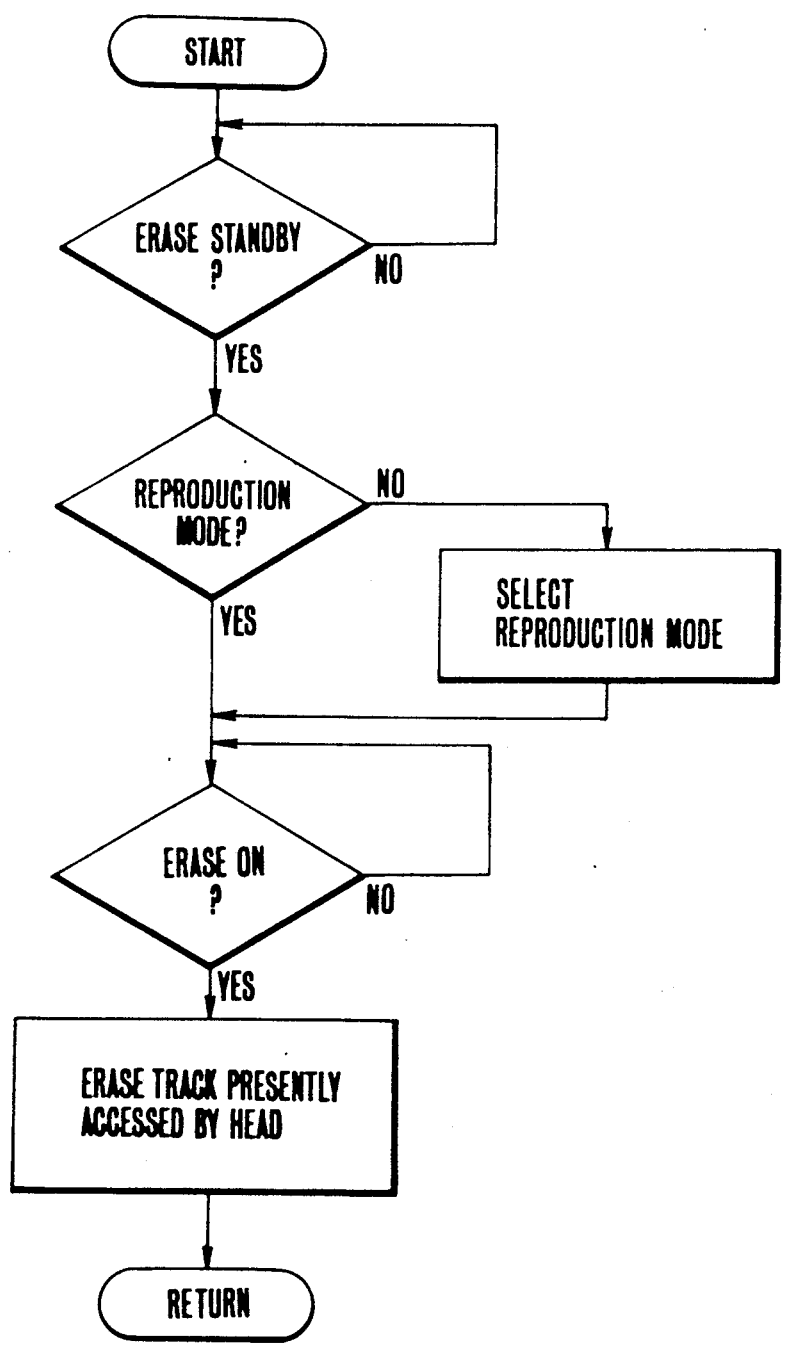
FIG. 3 is a drawing of a flowchart of the conventional art.

FIG. 2 is a flowchart of another embodiment of this invention.

In this embodiment, when the audio track corresponding to a video track is present, the audio erase mode is automatically selected.

In FIG. 2, when the erase standby mode is selected (S20), if the head 3 accesses an audio track (S21), the head is moved to the video track corresponding to that audio track (S22). Then, the presence of the audio track is indicated (S23). When the head 3 accesses a video track (S21), if there is the corresponding audio track (S24), the presence is indicated (S23).

When the erase on switch is pressed (S25), if there is no corresponding audio track (S26), a video track is erased (S27'). If there is the corresponding audio track, the audio erasing mode is selected, the head 3 is moved to the corresponding audio track (S27), erases an audio sequence (S28) and is then returned to the video track (S29).

In accordance with the above-described embodiments, when an audio signal is erased, the contents can be determined.

In addition, since an audio signal and a video signal are not erased random, the embodiments have the effect that the contents of the control code on an audio track correspond to those of a video signal.

A third embodiment of this invention is described below.

FIG. 7 is a block diagram which explains a configuration of the third embodiment. In FIG. 7, the elements having the same functions as those in FIG. 4 are denoted by the same reference numerals and thus they are not described below, and different elements alone are described below. In FIG. 7, reference numeral 114 denotes a system controller which executes the flowchart shown in FIG. 8 and which accepts an erase standby key 115, an audio on key 116, an erase single key 117, and an erase all key 118 and controls the head moving mechanism 17. In a procedure of operating the keys for the system controller 114, when the signals on all the tracks are erased, the erase standby key 115 is pressed, and the erase all key 118 is then pressed. When a video signal is erased, the audio on key 116 is turned off, the erase standby key 115 is pressed, and then the erase single key 117 is pressed. When an audio signal is erased, the audio on key 116 is turned on, the erase standby key 115 is pressed, and the erase single key 117 is pressed.

A description will now be made of the operation of the device shown in FIG. 7 with reference to the flowchart shown in FIG. 8.

A discrimination is made as to whether or not the erase standby key 115 is pressed, and if the erase standby key 115 is pressed, a discrimination is made within a given time as to whether or not the erase single key 117 or the erase all key 118 is pressed. If either of these keys is pressed, the operation is returned to the initial state (S32).

When the erase all key 118 is pressed (S33), the switch 5 is connected to the amplifier 12 by the system controller 114 so that the erasing signal from the erasing signal generator 11 is added to the head 3 and the signals in all the first to 50th tracks are erased in order of track number while the head being moved from the first track to the 50th track (S34), leading to the completion of the operation of erasing.

When the erase all key 118 is not pressed (S33), i.e., when the erase single key 117 is pressed, if it is determined by the AV discriminating circuit 8 that the track accessed by the head 3 is a video track which is unrelated to any audio sequence (S35), the erasing signal from the erasing signal generator 11 is added to the head 3 in the same way as that described above so that a video signal is erased (S36), leading to the completion of the operation of erasing.

If it is determined by the AV discriminating circuit 8 that the track accessed by the head 3 is a video track related to an audio sequence (S35), and when the audio on key 116 is not pressed (S37), the erasing signal is added to the head 3 in the same way as that described above so that a video signal is erased (S36), leading to the completion of the operation of erasing.

If it is determined by the AV discriminating circuit 8 that the track accessed by the head 3 is a video track related to an audio sequence (35), and when the audio on key 116 is pressed (S37), the head 3 is moved to the track on which the audio signal corresponding to the video signal recorded on that video track is recorded (S38), and the switch 5 is connected to the amplifier 12 by the system controller 114 so that the erasing signal from the erasing signal generator 11 is added to the head 3 and the sound in one audio sequence is erased (S39), leading to the completion of the operation of erasing.

In this embodiment, the signals recorded on all the tracks may be erased in the mode of erasing all tracks (S34).

In the mode of erasing a video signal (S36), a frame image and a field image may be separately or simultaneously erased.

In addition, in the embodiment, when the sound in one audio sequence is erased, erasure may be performed during the reproduction of an audio signal.

In this invention, when the sound in one audio sequence is erased, the sound in the sequence and the image in the sequence, i.e, the track on which the video signal corresponding to the audio signal in the sequence is recorded may be erased.

As described above, since audio signals are related to video signals and recorded, when an audio signal is erased, a discrimination is made as to whether or not the corresponding video signal is present in an audio sequence, and search for the sequence of that audio signal is made by using the video signal, whereby the sound in only one sequence is erased. It is therefore possible to erase an audio signal even if the number of the track in which the audio signal is recorded is not known.

In each of the above-described embodiments, video signals showing a still image and audio signals in a given time which must be reproduced in the form of pairs with the video signals are used as information signals and addition information signals which are reproduced in the form of pairs with the information signals, respectively, and a video floppy disk in which audio signals and video signals are mixed and recorded in conformity with the still video standard is used as a memory means in which the signals are recorded. However, this invention is not limited to this memory means, and various changes can be made within the scope of the claims. For example, a tape-shaped or card-shaped recording medium or a solid memory such as a semiconductor memory or a Bloch line memory may be used as the memory means.

What is claimed is:

1. An erasing device for erasing a signal recorded on memory means having blocks in each of which one of an audio signal and a video signal is recorded, comprising:
   a) erasing means for erasing a signal recorded in each of said blocks; and
   b) control means for controlling said erasing means so that, when one signal recorded in one of said blocks is erased, another signal related to said one signal and recorded in another track is erased, said control means including determining means for determining whether or not an audio signal related to a signal recorded in one of said blocks to be erased by said erasing means is present in said memory means.

2. An erasing device according to claim 1, wherein said memory means is a recording medium of a disk shape.

3. An erasing device according to claim 2, wherein said blocks are concentric tracks formed in said recording medium of a disk shape.

4. An erasing device according to claim 1, further comprising:
   c) display means for indicating the result of the determination by said determining means.

5. An erasing device according to claim 2, wherein said erasing means includes:
   A) a head for reproducing a signal recorded in each of said tracks; and
   B) means for supplying an erasing signal for erasing a signal recorded in each of said tracks to said head.

6. An erasing device for erasing a signal recorded on memory means having blocks in each of which an audio signal or a video signal is recorded, comprising:
   a) erasing means for erasing a signal recorded in each of said blocks; and
   b) control means for controlling said erasing means having a first erasing mode for controlling said erasing means so as to erase a signal recorded in one of said blocks, and a second erasing mode for controlling said erasing means so as to erase signals recorded in a plurality of blocks in which an audio signal is recorded and a block in which a video signal related to said audio signal is recorded, wherein said control means is arranged to search and erase the audio signal recorded in the plurality of blocks.

7. An erasing device according to claim 6, further comprising:
   c) selection means for selecting one of said first erasing mode and said second erasing mode.

8. An erasing device according to claim 7, wherein said control means includes a determining means for determining a kind of signal recorded in each of said blocks.

9. An erasing device for erasing a signal recorded on memory means having blocks in each of which an audio signal and a video signal is recorded, comprising:
   a) erasing means for erasing a signal recorded in each of said blocks;
   b) control means for controlling said erasing means having a first erasing mode for controlling said erasing means so as to erase a signal recorded in one of said blocks, and a second erasing mode for controlling said erasing means so as to erase signals recorded in a block in which an audio signal is recorded and a block in which a video signal is recorded, said control means including a determining means for determining a kind of signal recorded in each of said blocks; and
   c) selection means for selecting one of said first erasing mode and said second erasing mode in accordance with the result of the determination by said determining means.

10. An erasing device according to claim 7, wherein said selection means selects one of said first erasing mode and said second erasing mode in accordance with the operation of an operational member which is manually operated.

11. An erasing device according to claim 6, wherein memory means is a recording medium of a disk shape.

12. An erasing device according to claim 11, wherein said blocks are concentric tracks formed in said recording medium of a disk shape.

13. An erasing device according to claim 9, wherein said memory means is a recording medium of a disk shape.

14. An erasing device according to claim 9, wherein said blocks are concentric tracks formed in said recording medium of a disk shape.

15. An erasing device according to claim 9, in which each of said blocks is of same size.

16. An erasing device according to claim 15, wherein said memory means is a recording medium of a disk shape.

17. An erasing device for erasing a signal recorded on memory means having blocks in each of which one of an audio signal and video signal is recorded, comprising:
   a) erasing means for erasing a signal recorded in each of said blocks; and
   b) control means for controlling said erasing means, said control means having a mode in which only either one of said audio signal or said video signal is erased, based on a result of discrimination of a kind of signal recorded on a block to be erased by said erasing means.

18. An erasing device according to claim 17, further comprising:
   selection means for manually selecting a first mode in which only said audio signal is erased or a second mode in which only said video signal is erased.

19. An erasing device according to claim 17, wherein said memory means is a recording medium of a disk shape.

20. An erasing device according to claim 19, wherein said blocks are concentric tracks formed in said recording medium of a disk shape.

21. An erasing device according to claim 19, further comprising:
   c) display means for indicating the result of the determination by said determining means.

22. An erasing device according to claim 14, wherein each of said blocks is of the same size.

* * * * *

UNITED STATES PATENT AND TRADEMARK OFFICE
CERTIFICATE OF CORRECTION

PATENT NO. : 5,043,831

DATED : August 27, 1991

INVENTOR(S) : Tomotaka Muramoto and Makoto Takayama

It is certified that error appears in the above-identified patent and that said Letters Patent is hereby corrected as shown below:

Col. 2, line 43. After "signal" second occurrence insert -- which --

Col. 2, line 44. Delete "which"

Col. 2, line 62. After "and" insert -- 2; --

Col. 5, line 49. Change "random" to -- randomly --

Signed and Sealed this

First Day of December, 1992

Attest:

DOUGLAS B. COMER

Attesting Officer

Acting Commissioner of Patents and Trademarks